United States Patent
Bae et al.

(10) Patent No.: US 8,878,168 B2
(45) Date of Patent: Nov. 4, 2014

(54) ORGANIC LIGHT-EMITTING DISPLAY DEVICE WITH IMPROVED COLOR PROPERTY

(71) Applicant: Samsung Display Co., Ltd., Yongin-si (KR)

(72) Inventors: Jae-Woo Bae, Yongin-si (KR);
Kyoung-Tae Kim, Yongin-si (KR);
Young-Sang Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/791,769

(22) Filed: Mar. 8, 2013

(65) Prior Publication Data

US 2014/0070176 A1    Mar. 13, 2014

(30) Foreign Application Priority Data

Sep. 13, 2012 (KR) .......................... 10-2012-0101441

(51) Int. Cl.
*H01L 51/52* (2006.01)
*H01L 27/32* (2006.01)

(52) U.S. Cl.
CPC ............ *H01L 51/52* (2013.01); *H01L 27/3213* (2013.01)
USPC ................................ 257/40; 257/89; 313/500

(58) Field of Classification Search
USPC .................. 257/40, 89; 313/500, 505; 438/35
See application file for complete search history.

(56) References Cited

U.S. PATENT DOCUMENTS

| 2003/0128310 | A1  | 7/2003 | Takizawa et al. |
| 2007/0075627 | A1* | 4/2007 | Kimura et al. ................ 313/503 |
| 2012/0049726 | A1  | 3/2012 | Yoo et al. |

FOREIGN PATENT DOCUMENTS

| KR | 1020030047780 A | 6/2003 |
| KR | 1020050048833 A | 5/2005 |
| KR | 1020060000354 A | 1/2006 |
| KR | 1020120020087 A | 3/2012 |

* cited by examiner

*Primary Examiner* — Daniel Shook
(74) *Attorney, Agent, or Firm* — Christie, Parker & Hale, LLP

(57) ABSTRACT

An organic light-emitting display device including a red light-emitting layer that includes a deep-red light-emitting layer and a light-red light-emitting layer, and a blue light-emitting layer that includes a deep-blue light-emitting layer and a light-blue light-emitting layer. The organic light-emitting display device is capable of displaying a deep color and a light color so as to be distinguishable from each other.

15 Claims, 8 Drawing Sheets

ORGANIC LIGHT-EMITTING DISPLAY DEVICE WITH IMPROVED COLOR PROPERTY

CROSS-REFERENCE TO PATENT APPLICATION

This application claims priority to and the benefit of Korean Patent Application No. 10-2012-0101441, filed on Sep. 13, 2012, with the Korean Intellectual Property Office, the present disclosure of which is incorporated herein in its entirety by reference.

BACKGROUND

1. Field

The present disclosure relates to an organic light-emitting display device having improved color properties.

2. Description of the Related Art

An organic light-emitting display device is a self-emissive display device that displays images with organic light emitting diodes. The organic light-emitting display device is advantageous over a liquid crystal display in that it does not require a separate light source, and thus, may have relatively small thickness and a light weight. In addition, it has features of low power consumption, high luminance, and short response time.

The organic light-emitting display device may include a hole injection electrode, a light-emitting layer, and an electron injection electrode. Here, holes injected from the hole injection electrode and electrons injected from the electron injection electrode are combined with each other in the light-emitting layer to form excitons, and light is emitted by energy that is generated when the excitons fall to the ground state.

In an organic light-emitting display device, the three additive primary colors of red, green, and blue, may be used to display a desired color. In order to display the red, green, and blue colors, the organic light-emitting display device may include a red light-emitting layer, a green light-emitting layer, and a blue light-emitting layer, which form a red pixel, a green pixel and a blue pixel, respectively. A desired color may be displayed by adjusting the red, green, and blue pixels in the organic light-emitting display device.

The red pixel formed by the red light-emitting layer of the organic light-emitting layers may have a peak emission wavelength in the range of about 620 nm to about 630 nm, the green pixel formed by the green light-emitting layer may have a peak emission wavelength in the range of about 520 nm to about 540 nm, and the blue pixel formed by the blue light-emitting layer may have a peak emission wavelength in the range of about 445 nm to about 470 nm. When pixels having the above-described peak emission wavelengths are used, it is possible to display a variety of colors in display devices; however, it is not easy to display colors close to natural colors. For example, it is not easy to display a deep yellow and a light yellow so as to be distinguishable from each other, it is not easy to display a deep cyan color and a light cyan color so as to be distinguishable from each other, and it is not easy to display deep a magenta color and a light magenta color so as to be distinguishable from each other.

SUMMARY

Accordingly, an aspect of the present invention provides an organic light-emitting display device including an improved light-emitting layer and pixels, which may display additional colors as compared to other organic light-emitting display devices having a pixel structure including the three primary colors of red, green, and blue.

In accordance with one aspect of the present invention, there is provided an organic light-emitting display device including: a substrate; a first electrode on the substrate; a light-emitting layer on the first electrode; and a second electrode on the light-emitting layer. Here, the light-emitting layer includes a red light-emitting layer, a green light-emitting layer, and a blue light-emitting layer. The red light-emitting layer includes a deep-red light-emitting layer and a light-red light-emitting layer, and the blue light-emitting layer includes a deep-blue light-emitting layer and a light-blue light-emitting layer.

The deep-red light-emitting layer may be configured to have an emission peak at a wavelength ranging from about 660 nm to about 720 nm, and the light-red light-emitting layer may be configured to have an emission peak at a wavelength ranging from about 580 nm to about 620 nm.

The deep-blue light-emitting layer may be configured to have an emission peak at a wavelength ranging from about 420 nm to about 445 nm, and the light-blue light-emitting layer may be configured to have an emission peak at a wavelength ranging from about 470 nm to about 490 nm.

The green light-emitting layer may be configured to have an emission peak at a wavelength ranging from about 520 nm to about 540 nm.

The green light-emitting layer may include a deep-green light-emitting layer and a light-green light-emitting layer. The deep-green light-emitting layer may be configured to have an emission peak at a wavelength ranging from about 500 nm to about 520 nm, and the light-green light-emitting layer may be configured to have an emission peak at a wavelength ranging from about 540 nm to about 560 nm.

According to another embodiment of the present invention, an organic light-emitting display device includes a red pixel, a green pixel, and a blue pixel. Here, the red pixel includes a deep-red sub-pixel and a light-red sub-pixel, and the blue pixel includes a deep-blue sub-pixel and a light-blue sub-pixel.

The deep-red sub-pixel may be configured to have an emission peak at a wavelength ranging from about 660 nm to about 720 nm, and the light-red sub-pixel may be configured to have an emission peak at a wavelength ranging from about 580 nm to about 620 nm.

The deep-blue sub-pixel may be configured to have an emission peak at a wavelength ranging from about 420 nm to about 445 nm, and the light-blue sub-pixel may be configured to have an emission peak at a wavelength ranging from about 470 nm to about 490 nm.

The green pixel may be configured to have an emission peak at a wavelength ranging from about 520 nm to about 540 nm.

The green pixel may include a deep-green sub-pixel and a light-green sub-pixel. The deep-green sub-pixel may be configured to have an emission peak at a wavelength ranging from about 500 nm to about 520 nm, and the light-green sub-pixel may be configured to have an emission peak at a wavelength ranging from about 540 nm to about 560 nm.

BRIEF DESCRIPTION OF THE DRAWINGS

The above and other features and aspects of the present invention will be more clearly understood from the following detailed description taken in conjunction with the accompanying drawings, in which.

DETAILED DESCRIPTION

Figure 1:
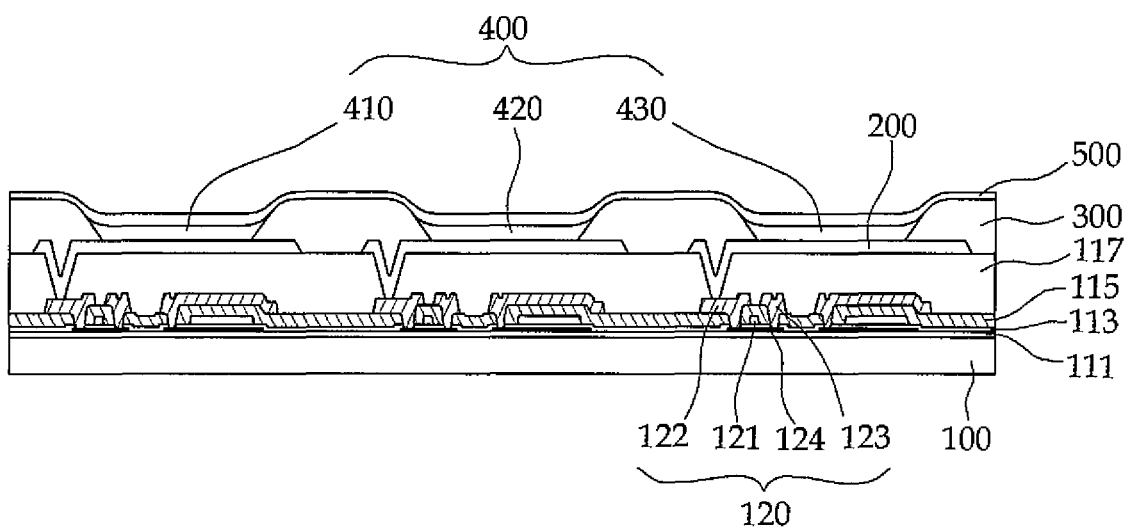
FIG. 1 is a schematic cross-sectional view illustrating the structure of an organic light-emitting display device.

Hereinafter, the present invention will be described in detail with reference to the embodiments shown in the accompanying drawings. However, the scope of the present invention is not limited to the following description or the embodiments shown in the drawings. The accompanying drawings are only for illustration of embodiments selected from among the various embodiments of the present disclosure, and thus, should not limit the scope of the present invention.

In the drawings, certain elements or shapes may be simplified or exaggerated to better illustrate the disclosure, and other elements present in an actual product may also be omitted. Thus, the drawings are intended to facilitate the understanding of the disclosure.

Throughout the disclosure, like reference numerals refer to like elements throughout the various figures and embodiments of the present invention. In addition, when a layer or element is referred to as being "on" another layer or element, the layer or element may be directly on the other layer or element, or one or more intervening layers or elements may be interposed therebetween.

As shown in FIG. 1, an organic light-emitting display device may include a substrate 100, a first electrode 200 on the substrate 100, a light-emitting layer 400 on the first electrode 200, and a second electrode 500 on the light-emitting layer 400.

The embodiment in FIG. 1 illustrates a top-emitting organic light-emitting display device in which light emitted from the light-emitting layer 400 is transmitted through the second electrode 500 opposite the substrate 100.

The substrate 100 may be formed of a glass or polymer plastic that is used in organic light-emitting display devices. The substrate 100 may be transparent or non-transparent. The substrate 100 that is used in an embodiment may be suitably selected by those skilled in the art according to the intended use.

The first electrode 200 may be disposed on the substrate 100. Before the first electrode 200 is formed, a plurality of thin film transistors 120 may be formed. Each of the thin film transistors 120 includes a gate electrode 121, a drain electrode 122, a source electrode 123, and a semiconductor layer 124, which are formed on the substrate 100. In addition, the thin film transistor 120 may also include a gate insulating layer 113 and an interlayer insulating layer 115. However, the thin film transistor 120 is not limited to the structure shown in FIG. 1 and may also include other structures. Between the thin film transistor 120 and the first substrate 100, a buffer layer 111 formed, for example, of silicon oxide or silicon nitride may be provided.

The first electrode 200, the light-emitting layer 400, and the second electrode 500 may be sequentially formed on the thin film transistors 120 and are collectively called an organic light-emitting device unit.

In the embodiment shown in FIG. 1, the first electrode 200 is a pixel electrode corresponding to an anode that is electrically connected to the thin film transistor 120, and the second electrode 500 is a common electrode corresponding to a cathode.

The first electrode 200 may be electrically connected to the underlying thin film transistor 120 disposed below thereof. A planarization layer 117 may cover the thin film transistor 120. Here, the first electrode 200 is disposed on the planarization layer 117 and is electrically connected with the thin film transistor 120 through a contact hole in the planarization film 117.

The first electrode 200 may be a transparent or reflective electrode. When the first electrode 200 is a transparent electrode, it may be formed of indium tin oxide (ITO), indium zinc oxide (IZO), zinc oxide (ZnO), or indium(III) oxide ($In_2O_3$), and when it is a reflective electrode, it may include a reflective layer, formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a layer formed of ITO, IZO, ZnO or $In_2O_3$ on the reflective layer. If the first electrode 200 is an anode, it may be made of, for example, ITO.

FIG. 1 illustrates that the first electrode 200 as an anode and the second electrode 500 as a cathode, but the first electrode 200 may be a cathode and the second electrode may be an anode.

Between the first electrodes 200, a pixel defining layer (PDL) 300 may be provided. The pixel defining layer 300 is formed of an insulating material and separates (or divides) the first electrodes 200 into corresponding pixel units. For example, the pixel defining layer 300 may be disposed at the edges of the first electrodes 200 to separate (or divide) the first electrodes 200 into corresponding pixel units, thereby defining pixel regions. The pixel defining layer 300 may cover the edges of the first electrode 200.

On the first electrode 200, an auxiliary light-emitting layer, such as a hole injection layer, a hole transport layer, or both, may be disposed (not shown).

The light-emitting layer 400 may be on the first electrode 200. If the auxiliary light-emitting layer is disposed on the first electrode 200, the light-emitting layer 400 may be on the auxiliary light-emitting layer. The light-emitting layer 400 is formed in the pixel regions, which are openings formed on the first electrodes 200 separated (or divided) by the pixel defining layer 300. The light-emitting layer includes a red light-emitting layer 410, a green light-emitting layer 420, and a blue light-emitting layer 430. The red light-emitting layer 410, the green light-emitting layer 420, and the blue light-emitting layer 430 correspond to a red pixel, a green pixel and a blue pixel, respectively. The second electrode 500 is on the light-emitting layer 400.

At least one of an electron injection layer or an electron transport layer may be disposed between the light-emitting layer 400 and the second electrode 500. The light-emitting layer 400, the hole injection layer, the hole transport layer, the electron transport layer, and the electron injection layer may be organic layers. The organic layers may be formed of low-molecular-weight organic materials or high-molecular-weight organic materials.

The low-molecular-weight organic materials may be included in the hole injection layer, the hole transport layer, the light-emitting layer, the electron transport layer or the electron injection layer. The low-molecular-weight organic materials may be deposited so as to form single or composite structures, and examples of organic materials that may be used in the present invention include copper phthalocyanine (CuPc), N,N'-di-(naphthalene-1-yl)-N,N'-diphenyl-benzidine (NPB), tris-8-hydroxyquinoline aluminum (Alq3) and the like. These low-molecular-weight organic materials may be deposited by, for example, vacuum evaporation using a mask. In addition, these materials may be deposited by a printing method such as inkjet or gravure printing.

The high-molecular-weight organic materials may be included in, for example, the hole injection layer (HIL), the hole transport layer (HTL), or the light-emitting layer (EML). For example, the hole transport layer may be formed of PEDOT, and the light-emitting layer may be formed of a high-molecular-weight organic material such as poly-phenylenevinylene (PPV) or polyfluorene.

The second electrode 500 may also be a transparent or reflective electrode. When the second electrode 500 is a transparent electrode, it may include a layer, formed of, for example, lithium (Li), calcium (Ca), lithium fluoride/calcium (LiF/Ca), lithium fluoride/aluminum LiF/Al, Al, Mg, or a compound thereof, and a layer formed thereon and consisting of a transparent electrode-forming material such as ITO, IZO, ZnO or $In_2O_3$. When the second electrode 500 is a reflective electrode, it may be formed of, for example, Li, Ca, LiF/Ca, LiF/Al, Al, Mg, or a compound thereof. In the top-emitting organic light-emitting display device shown in FIG. 1, the second electrode 500 is formed of a transparent electrode. For example, the second electrode 500 may be formed of LiF/Al.

On the second electrode 500, a sealing or encapsulating layer may further be formed.

Figure 2:
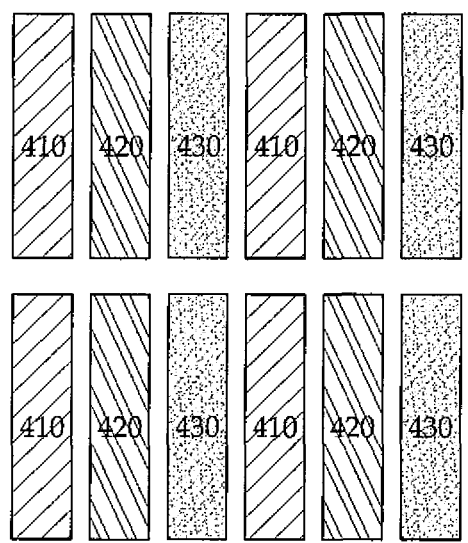
FIG. 2 is a schematic plan view of a light-emitting layer portion of an organic light-emitting display device.
Figure 3:
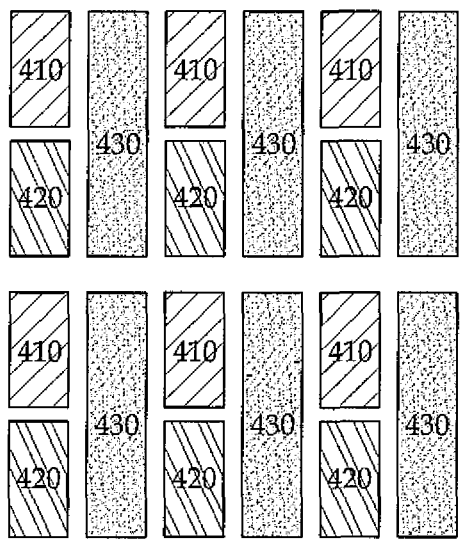
FIG. 3 is a schematic plan view of another example of a light-emitting layer portion of an organic light-emitting display device.

FIGS. 2 and 3 are schematic plan views of an arrangement of a red light-emitting layer 410, a green light-emitting layer 420, and a blue light-emitting layer 430, which form the light-emitting layer 400. In the organic light-emitting display device shown in FIG. 1, the light-emitting layer 400 may be formed as shown in FIG. 2 or 3 when viewed from the top.

The red light-emitting layer 410, the green light-emitting layer 420, and the blue light-emitting layer 430, which are shown in FIGS. 2 and 3, form a red pixel, a green pixel, and a blue pixel, respectively.

In order to display full colors in the organic light-emitting display device, basic pixels displaying the three primary colors of light, red, green, and blue may be used. In FIGS. 2 and 3, pixels of the three additive primary colors, red, green, and blue are formed on (e.g., directly on) the substrate according to a suitable (or predetermined) pattern. However, a pattern of red, green, and blue pixels is not limited to those shown in FIGS. 2 and 3.

Figure 4:
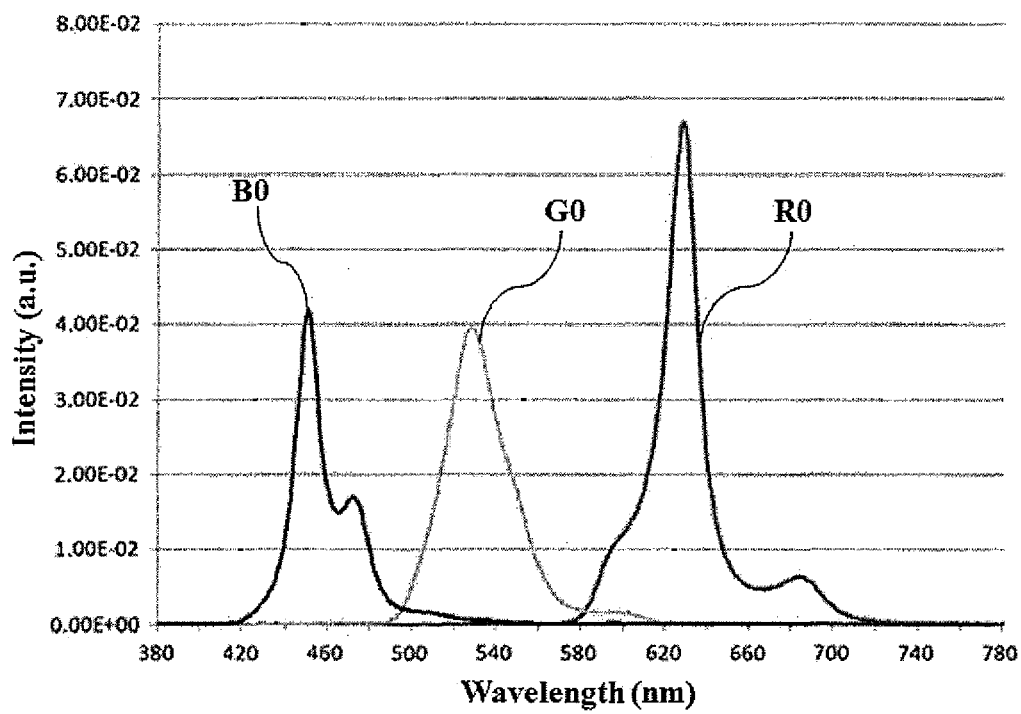
FIG. 4 shows examples of emission spectrums of red (R0), green (G0) and blue (B0) emitting layers.

The three primary colors of light may generally have the emission wavelength ranges (or spectrums) shown in FIG. 4. Specifically, red (R0) generally has an emission peak at a wavelength ranging from about 620 nm to about 630 nm, green (G0) has an emission peak at a wavelength ranging from about 520 nm to about 540 nm, and blue (B0) has an emission peak at a wavelength ranging from about 445 nm to about 460 nm.

When pixels emitting the three primary colors of light (red (R0), green (G0), and blue (B0)) are formed on (or directly on) the display device as described above, it is possible to display the colors of the sRGB region, an example of a color space standard that is used for broadcasting or the like. However, it is not easy to display natural colors.

Figure 5:
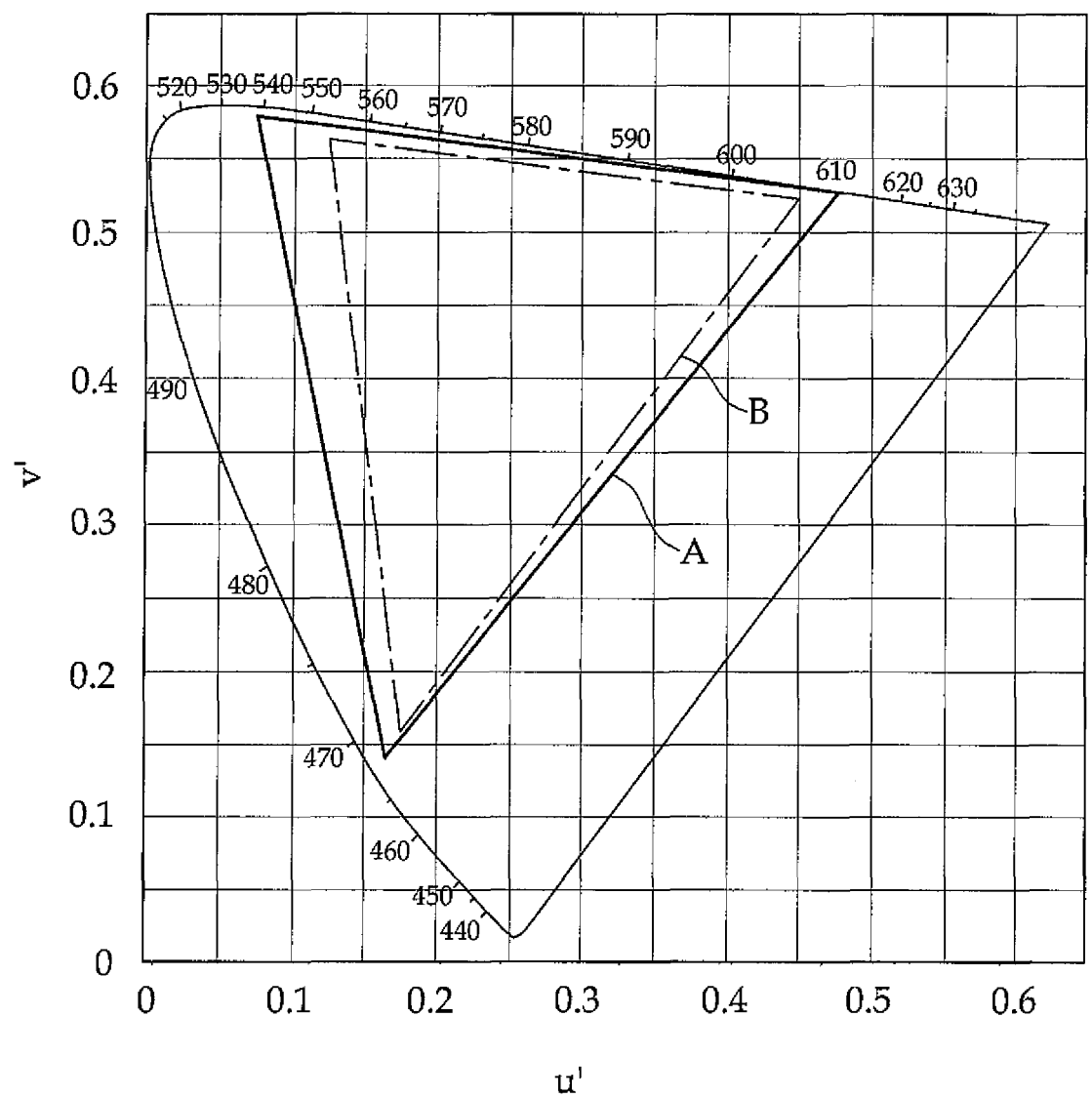
FIG. 5 shows a CIELUV 1976 uniform color space diagram, which is an example of a color space, a sRGB region (region B) and an OLED RGB color space (region A).

FIG. 5 shows a color distribution according to the CIELUV 1976 uniform color space diagram, which is an example of a color space. In FIG. 5, the region indicated by the dotted line B represents the sRGB region that is the color space standard used for broadcasting, and the region indicated by the solid line A represents an OLED RGB color space that is a color distribution region displayed by a general organic light-emitting display device that directly uses the three primary colors of light, red, green, and blue. As shown in FIG. 5, the OLED RGB color space (which is the color distribution region displayed by the organic light-emitting display device) is broader than the sRGB region, and thus, even when the three primary colors of light (i.e., red, green, and blue) are directly used in the organic light-emitting display device, it is possible to display the colors of the sRGB region.

However, as shown in FIG. 5, colors present in nature are also present in regions other than the sRGB region or the OLED RGB color space. For example, various colors of cyan, yellow, and magenta are present outside the sRGB region. For example, yellow colors having various chroma values, for example, deep yellow, light yellow, and the like, are present in regions outside the sRGB region and the OLED RGB color space. However, when the three primary colors, red, green, and blue are directly used, it is not easy to display various colors present in nature.

Thus, according to one embodiment of the present disclosure, in the organic light-emitting display device including red, green, and blue pixels, the red pixel is divided into a deep-red sub-pixel and a light-red sub-pixel, and the blue pixel is divided into a deep-blue sub-pixel and a light-blue sub-pixel, thereby improving the color display characteristics of the organic light-emitting display device.

Specifically, an organic light-emitting display device according to one embodiment of the present invention includes a substrate 100, a first electrode 200 on the substrate 100, a light-emitting layer 400 on the first electrode 200, and a second electrode 500 on the light-emitting layer 400, wherein the light-emitting layer 400 includes a red light-emitting layer 410, a green light-emitting layer 420, and a blue light-emitting layer 430, in which the red light-emitting layer 410 includes a deep-red light-emitting layer 411 and a light-red light-emitting layer 412, and the blue light-emitting layer 430 includes a deep-blue light-emitting layer 431 and a light-blue light-emitting layer 432. This structure of the organic light-emitting display device may be easily understood with reference to FIGS. 1 and 6.

Figure 7:
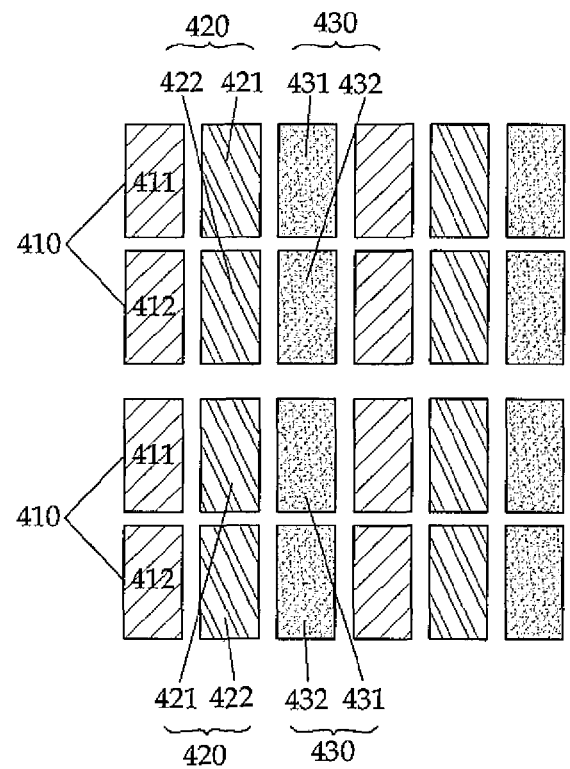

According to another embodiment, and as shown in FIG. 7, the green light-emitting layer 420 may be divided into a deep-green light-emitting layer 421 and a light-green light-emitting layer 422.

Figure 8:
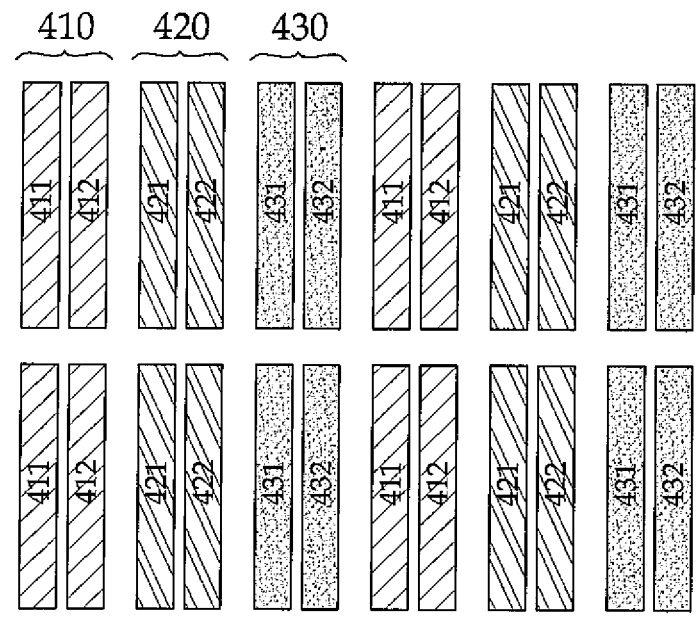

FIG. 8 illustrates another embodiment of the present invention, in which each of the red light emitting layer 410, the green light-emitting layer 420, and the blue light-emitting layer 430 is divided vertically such that they include a combination of the deep-red light-emitting layer 411 and the light-red light-emitting layer 412, a combination of the deep-green light-emitting layer 421 and the light-green light emitting layer 422, and a combination of the deep-blue light-emitting layer 431 and the light-blue light-emitting layer 432, respectively.

Figure 9:
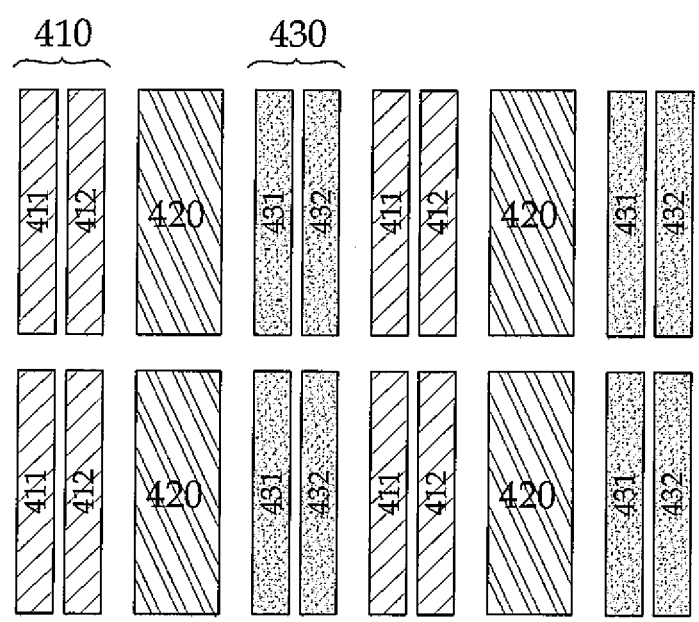
Figure 10:
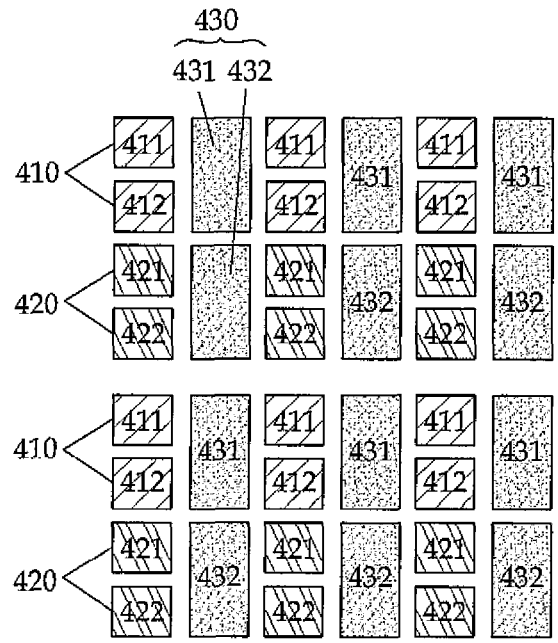
Figure 11:
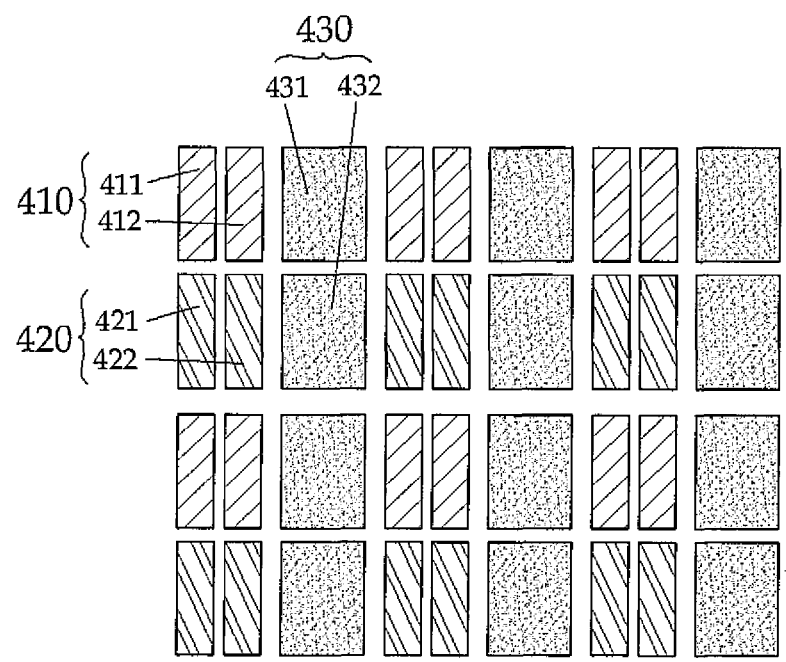

FIG. 9 shows an embodiment in which the green light-emitting layer 420 is not divided vertically. FIGS. 10 and 11 show further embodiments of the light-emitting layer.

In the red light-emitting layer 410, the peak emission wavelength of the deep-red light-emitting layer 411 is longer than that of a general red light-emitting layer. The deep-red light-emitting layer 411 may have an emission peak at a wavelength ranging from about 660 nm to about 720 nm. In addition, the peak emission wavelength of the light-red light-emitting layer 412 is shorter than that of a general red light-emitting layer. The light-red light-emitting layer 412 may have an emission peak at a wavelength ranging from about 580 nm to about 620 nm.

Figure 12:
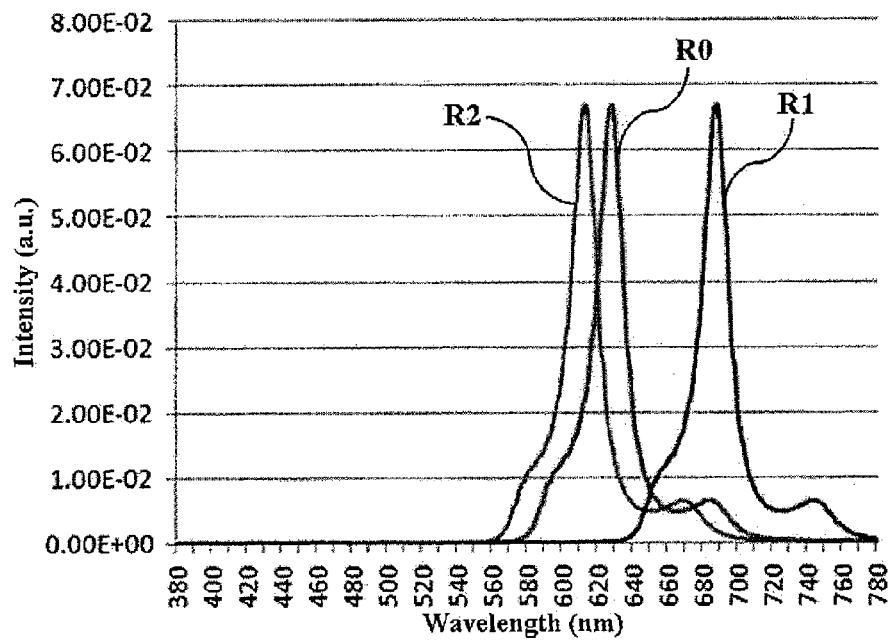
FIG. 12 is a graph of the emission spectrum of a red light-emitting layer (R0), and the emission spectrum of a deep-red light-emitting layer (R1) and a light-red light-emitting layer (R2), which constitute a red light-emitting layer according to one embodiment of the present disclosure.

FIG. 12 shows the emission spectrum of the red light-emitting layer. In FIG. 12, R0 represents the emission spectrum of general red, R1 represents the emission spectrum of deep red, and R2 represents the emission spectrum of light red.

The deep-red light-emitting layer 411 and the light-red light-emitting layer 412 may be formed by a conventional method for forming light-emitting layers. The deep-red light-emitting layer 411 and the light-red light-emitting layer 412 may be formed of prepared light-emitting materials or commercially available light-emitting materials, which are selected in view of the emission wavelengths thereof. As the light-emitting materials for forming the deep-red light-emitting layer 411 and the light-red light-emitting layer 412, any materials may be used without limitation, as long as they may achieve the above-described wavelength ranges.

In the blue light-emitting layer 430, the peak emission wavelength of the deep-blue light-emitting layer 431 is shorter than that of a general blue light-emitting layer. The deep-blue light-emitting layer 431 may have an emission peak at a wavelength ranging from about 420 nm to about 445 nm. In addition, the peak emission wavelength of the light-blue light-emitting layer 432 is longer than that of a general blue light-emitting layer. The light-blue light-emitting layer 432 may have an emission peak at a wavelength ranging from about 470 nm to about 490 nm.

Figure 13:
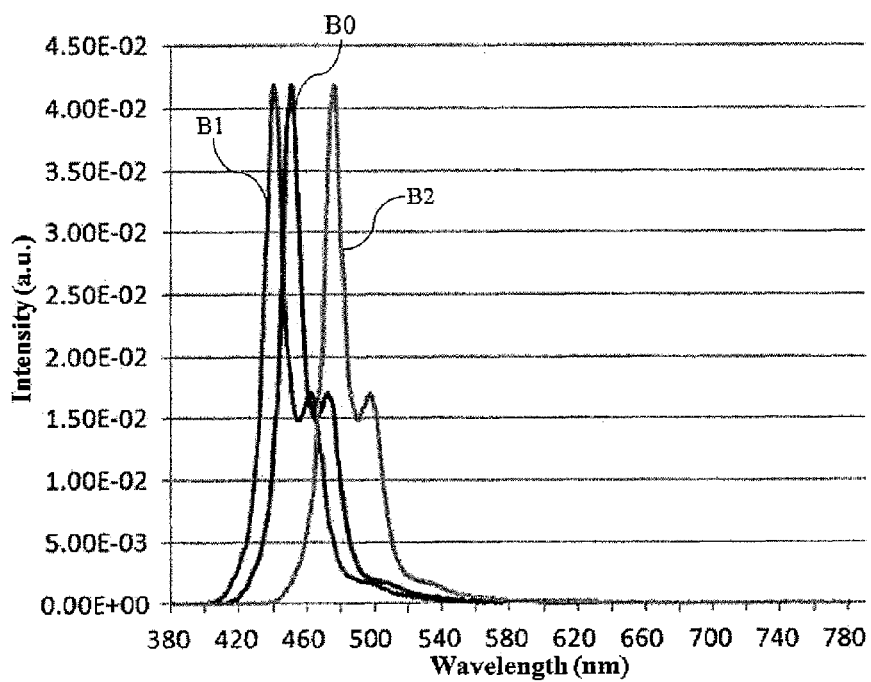
FIG. 13 is a graph of the emission spectrum of a blue light-emitting layer (B0), and the emission spectrum of a deep-blue light-emitting layer (B1) and a light-blue light-emitting layer (B2), which constitute a blue light-emitting layer according to one embodiment of the present disclosure.

FIG. 13 shows the emission spectrum of the blue light-emitting layer. In FIG. 13, B0 represents the emission spectrum of general blue, B1 represents the emission spectrum of deep blue, and B2 represents the emission spectrum of light blue.

The deep-blue light-emitting layer 431 and the light-blue light-emitting layer 432 may be formed by a conventional method for forming light-emitting layers. The deep-blue light-emitting layer 431 and the light-blue light-emitting layer 432 may be formed of prepared light-emitting materials or commercially available light-emitting materials, which are selected in view of the emission wavelengths thereof. Regarding the light-emitting materials for forming the deep-blue light-emitting layer 431 and the light-blue light-emitting layer 432, any materials may be used without limitation as long as they may achieve the above-described wavelength ranges.

In the green light-emitting layer 420, the peak emission wavelength of the deep-green light-emitting layer 421 is shorter than that of a general green light-emitting layer. The deep-green light-emitting layer 421 may have an emission peak at a wavelength ranging from about 500 nm to about 520 nm. In addition, the peak emission wavelength of the light-green light-emitting layer 422 is longer than that of a general green light-emitting layer. The light-green light-emitting layer 422 may have an emission peak at a wavelength ranging from about 540 nm to about 560 nm.

Figure 14:
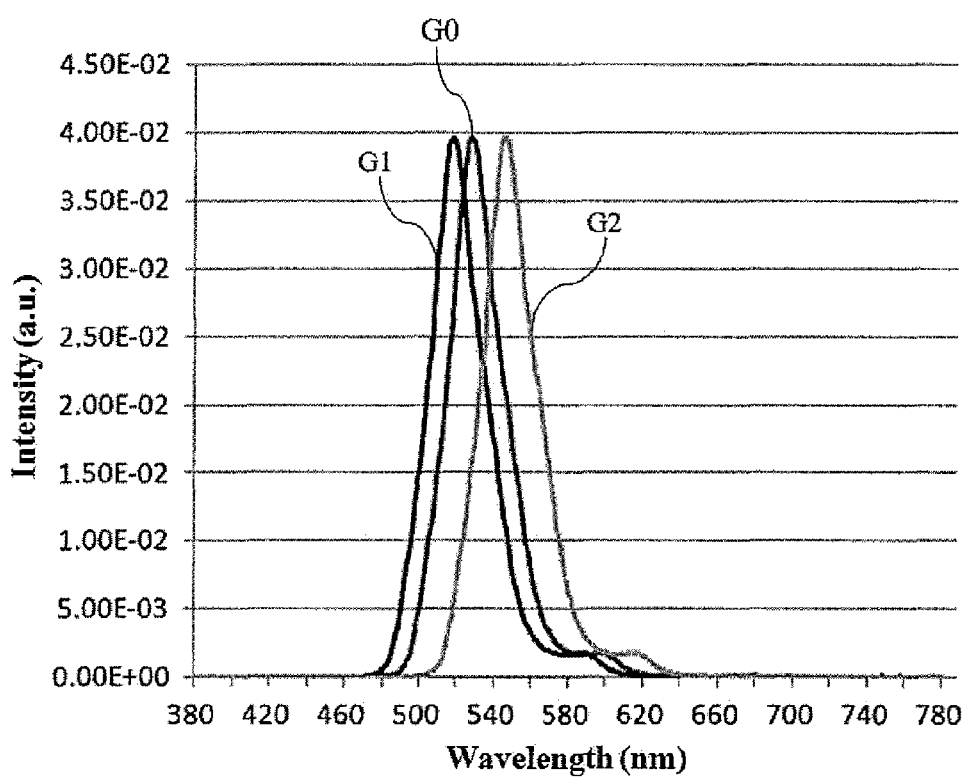
FIG. 14 is a graph of the emission spectrum of a green light-emitting layer (G0), and the emission spectrum of a deep-green light-emitting layer (G1) and a light-green light-emitting layer (G2), which constitute a green light-emitting layer according to one embodiment of the present disclosure.

FIG. 14 shows the emission spectrum of the green light-emitting layer. In FIG. 14, G0 represents the emission spectrum of general green, G1 represents the emission spectrum of deep green, and G2 represents the spectrum wavelength of light green.

The deep-green light-emitting layer 421 and the light-green light-emitting layer 422 may be formed by a conventional method for forming light-emitting layers. The deep-green light-emitting layer 421 and the light-green light-emitting layer 422 may be formed of prepared light-emitting materials or commercially available light-emitting materials, which are selected in view of the emission wavelengths thereof. Regarding the light-emitting materials for forming the deep-green light-emitting layer 421 and the light-green light-emitting layer 422, any materials may be used without limitation as long as they may achieve the above-described wavelength ranges.

In addition, FIGS. 7 and 9 show embodiments in which the green light-emitting layer 420 is not divided into a deep-green light-emitting layer and a light-green light-emitting layer. In this case, the emission spectrum of the green light-emitting layer 420 corresponds to the emission spectrum indicated by G0 in FIG. 14. For example, the peak emission wavelength of the green light-emitting layer 420 (which is not divided into a deep-green light-emitting layer and a light-green light-emitting layer) may range from about 520 nm to about 540 nm.

Figure 6:
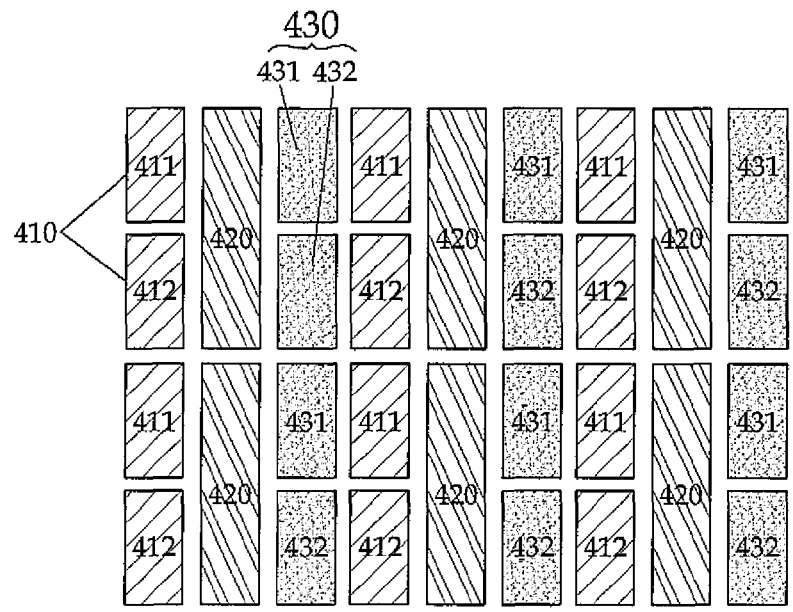
FIGS. 6 to 11 are schematic plan views of patterns of light-emitting layers in an organic light-emitting display device according to embodiments of the present disclosure.

From the view point of pixels, the organic light-emitting display device according to one embodiment of the present invention includes a red pixel, a green pixel, and a blue pixel, in which the red pixel may include a deep-red sub-pixel and a light-red sub-pixel, and the blue pixel may include a deep-blue sub-pixel and a light-blue sub-pixel (see FIGS. 1 and 6).

In addition, the green pixel may include a deep-green sub pixel and a light-green sub-pixel (FIG. 7).

FIGS. 6 to 11 show patterns of the light-emitting layer, but may also be applied to patterns of the pixels. When the red light-emitting layer 410, the green light-emitting layer 420, and the blue light-emitting layer 430, which form the light-emitting layer 430, are patterned as shown in FIGS. 6 to 11, a red pixel, a green pixel, and a blue pixel, which correspond thereto, may also be patterned as shown in FIGS. 6 to 11.

For example, the deep-red sub-pixel may correspond to the deep-red light-emitting layer 411, and the light-red sub-pixel may correspond to the light-red light-emitting layer 412. Similarly, the deep-green sub-pixel may correspond to the deep-green light-emitting layer 421, and the light-green sub-pixel may correspond to the light-green light-emitting layer 422. In addition, the deep-blue sub-pixel may correspond to the deep-blue light-emitting layer 431, and the light-blue sub-pixel may correspond to the light-blue light-emitting layer 432.

Similar to the light-emitting layers, the deep-red sub-pixel may have an emission peak at a wavelength ranging from about 660 nm to about 720 nm, and the light-red sub-pixel may have an emission peak at a wavelength ranging from about 580 nm to about 620 nm.

In addition, the deep-blue sub-pixel may have an emission peak at a wavelength ranging from about 420 nm to about 445 nm, and the light-blue sub-pixel may have an emission peak at wavelength ranging from about 470 nm to about 490 nm.

Similarly, the deep-green sub-pixel may have an emission peak at a wavelength ranging from about 500 nm to about 520 nm, and the light-green sub-pixel may have an emission peak at a wavelength ranging from about 540 nm to about 560 nm.

As described above, the organic light-emitting display device according to the embodiments of the present disclosure may display additional colors compared to a conventional organic light-emitting display device having pixels including only the three primary colors, red, green, and blue. In addition, the organic light-emitting display device according to the embodiments of the present invention may display a deep color and a light color so as to be distinguishable from each other even in the case of the same color, and thus may display colors close to natural colors.

Although the disclosed embodiments of the present invention have been described for illustrative purposes with reference to the accompanying drawings, those skilled in the art will appreciate that various modifications, additions and substitutions are possible, without departing from the scope and spirit of the invention as disclosed in the accompanying claims and their equivalents.

What is claimed is:

1. An organic light-emitting display device comprising:
a substrate;
a first electrode on the substrate;
a light-emitting layer on the first electrode; and
a second electrode on the light-emitting layer,
wherein the light-emitting layer comprises a red light-emitting layer, a green light-emitting layer, and a blue light-emitting layer,
wherein the red light-emitting layer is divided vertically into a deep-red light-emitting layer and a light-red light-emitting layer such that the deep-red light-emitting layer and the light-red light-emitting layer are adjacent each other,
wherein the blue light-emitting layer is divided vertically into a deep-blue light-emitting layer and a light-blue light-emitting layer such that the deep-blue light-emitting layer and the light-blue light-emitting layer are adjacent each other, and
wherein the green light-emitting layer is between the red light-emitting layer and the blue light-emitting layer.

2. The organic light-emitting display device of claim 1, wherein the deep-red light-emitting layer is configured to have an emission peak at a wavelength ranging from about 660 nm to about 720 nm, and the light-red light-emitting layer is configured to have an emission peak at a wavelength ranging from about 580 nm to about 620 nm.

3. The organic light-emitting display device of claim 1, wherein the deep-blue light-emitting layer is configured to have an emission peak at a wavelength ranging from about 420 nm to about 445 nm, and the light-blue light-emitting layer is configured to have an emission peak at a wavelength ranging from about 470 nm to about 490 nm.

4. The organic light-emitting display device of claim 1, wherein the green light-emitting layer is configured to have an emission peak at a wavelength ranging from about 520 nm to about 540 nm.

5. The organic light-emitting display device of claim 1, wherein the green light-emitting layer comprises a deep-green light-emitting layer and a light-green light-emitting layer.

6. The organic light-emitting display device of claim 5, wherein the deep-green light-emitting layer is configured to have an emission peak at a wavelength ranging from about 500 nm to about 520 nm, and the light-green light-emitting layer is configured to have an emission peak at a wavelength ranging from about 540 nm to about 560 nm.

7. The organic light-emitting display device of claim 1, wherein the green light-emitting layer is divided vertically into a deep-green light-emitting layer and a light-green light-emitting layer such that the deep-green light-emitting layer and the light-green light-emitting layer are adjacent each other.

8. The organic light-emitting display device of claim 7,
wherein the deep-green light-emitting layer is between the light-red light-emitting layer and the light-green light-emitting layer, and
wherein the light-green light-emitting layer is between the deep-green light-emitting layer and the deep-blue light-emitting layer.

9. The organic light-emitting display device of claim 1, wherein the green light-emitting layer is between the light-red light-emitting layer and the deep-blue light-emitting layer.

10. An organic light-emitting display device comprising pixels and sub-pixels, wherein all of the pixels and the sub-pixels of the organic light-emitting display device consist of five types, the five types being:
a deep-red sub-pixel, a light-red sub-pixel, a deep-blue sub-pixel, a light-blue sub-pixel, and a green pixel that is not divided into a deep-green sub-pixel and a light-green sub-pixel.

11. The organic light-emitting display device of claim 10, wherein the deep-red sub-pixel is configured to have an emission peak at a wavelength ranging from about 660 nm to about 720 nm, and the light-red sub-pixel is configured to have an emission peak at a wavelength ranging from about 580 nm to about 620 nm.

12. The organic light-emitting display device of claim 10, wherein the deep-blue sub-pixel is configured to have an emission peak at a wavelength ranging from about 420 nm to about 445 nm, and the light-blue sub-pixel is configured to have an emission peak at a wavelength ranging from about 470 nm to about 490 nm.

13. The organic light-emitting display device of claim 10, wherein the green pixel is configured to have an emission peak at a wavelength ranging from about 520 nm to about 540 nm.

14. An organic light-emitting display device comprising:
a substrate;
a first electrode on the substrate;
a light-emitting layer on the first electrode; and
a second electrode on the light-emitting layer,
wherein the light-emitting layer comprises a red light-emitting layer, a green light-emitting layer, and a blue light-emitting layer,
wherein the red light-emitting layer is divided into a deep-red light-emitting layer and a light-red light-emitting layer such that the deep-red light-emitting layer and the light-red light-emitting layer are adjacent each other,
wherein the blue light-emitting layer is divided into a deep-blue light-emitting layer and a light-blue light-emitting layer such that the deep-blue light-emitting layer and the light-blue light-emitting layer are adjacent each other,
wherein the green light-emitting layer is divided into a deep-green light-emitting layer and a light-green light-emitting layer such that the deep-green light-emitting layer and the light-green light-emitting layer are adjacent each other, and
wherein a size of each of the deep-blue light-emitting layer and the light-blue light-emitting layer is larger than a size of each of the deep-red light-emitting layer, the light-red light-emitting layer, the deep-green light-emitting layer, and the light-green light-emitting layer.

15. The organic light-emitting display device of claim 14, wherein the size of each of the deep-blue light-emitting layer and the light-blue light-emitting layer is about twice the size of each of the deep-red light-emitting layer, the light-red light-emitting layer, the deep-green light-emitting layer, and the light-green light-emitting layer.

* * * * *